United States Patent
Chua et al.

(10) Patent No.: US 7,495,383 B2
(45) Date of Patent: Feb. 24, 2009

(54) PHOSPHOR BASED ON A COMBINATION OF QUANTUM DOT AND CONVENTIONAL PHOSPHORS

(75) Inventors: Janet Bee Yin Chua, Penang (MY); Yue Hoong Lau, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 506 days.

(21) Appl. No.: 11/195,199

(22) Filed: Aug. 1, 2005

(65) Prior Publication Data

US 2007/0024175 A1 Feb. 1, 2007

(51) Int. Cl.
*H01J 1/62* (2006.01)
*H01J 63/04* (2006.01)

(52) U.S. Cl. ............... 313/503; 313/483; 313/486; 313/498; 313/499; 313/501; 313/502; 313/512; 252/301.4 R; 252/301.6 R; 252/301.6 F; 257/14; 257/676; 257/E29.071

(58) Field of Classification Search ............ 313/483, 313/486, 498, 499, 501–503; 252/301.4 R–301.4 H; 257/14, 676, E29.071
See application file for complete search history.

(56) References Cited

U.S. PATENT DOCUMENTS

| | | | |
|---|---|---|---|
| 6,501,091 B1 * | 12/2002 | Bawendi et al. | 257/14 |
| 7,102,152 B2 * | 9/2006 | Chua et al. | 257/14 |
| 2003/0092345 A1 | 5/2003 | Wang et al. | |
| 2003/0203524 A1 * | 10/2003 | Farahi et al. | 438/26 |
| 2006/0081862 A1 | 4/2006 | Chua et al. | |
| 2006/0157686 A1 | 7/2006 | Jang et al. | |

* cited by examiner

*Primary Examiner*—Nimeshkumar D Patel
*Assistant Examiner*—Thomas A Hollweg

(57) ABSTRACT

A phosphor composition and a light source constructed therefrom are disclosed. The phosphor composition includes first and second phosphors. The first phosphor includes first phosphor particles that convert light of an excitation wavelength to light having a first spectrum characterized by an intensity of light that varies as a function of wavelength. The first phosphor particles are chosen such that the first spectrum is independent of the size of the particles. The second phosphor includes particles of a QD phosphor that convert the excitation light to light in a QD phosphor spectrum. The first phosphor particles and the QD phosphor particles are present in a ratio of concentrations. The ratio, the first phosphor particles, and the QD phosphor particles are chosen such that a combined spectrum has an intensity that is more uniform as a function of wavelength than either the QD phosphor spectrum or the first spectrum.

21 Claims, 3 Drawing Sheets

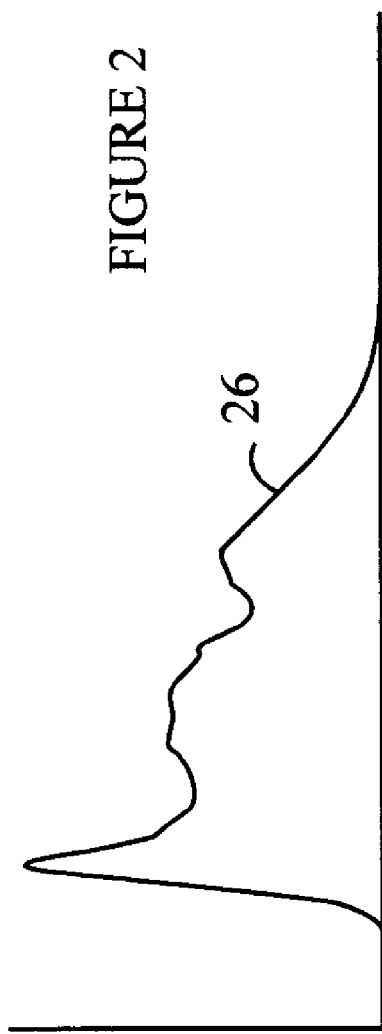
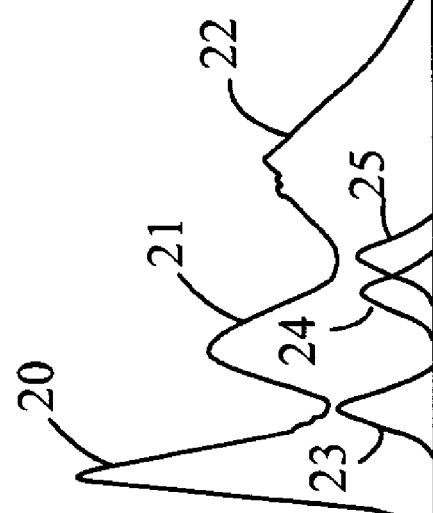
FIGURE 2
FIGURE 1

PHOSPHOR BASED ON A COMBINATION OF QUANTUM DOT AND CONVENTIONAL PHOSPHORS

BACKGROUND OF THE INVENTION

Light emitting diodes (LEDs) are attractive candidates for replacing conventional light sources such as incandescent lamps and fluorescent light sources. The LEDs have higher light conversion efficiencies and longer lifetimes than the conventional sources. Unfortunately, LEDs produce light in a relatively narrow spectral band. Hence, to produce a light source having an arbitrary color, a compound light source having multiple LEDs is typically utilized. For example, an LED-based light source that provides an emission that is perceived as matching a particular color can be constructed by combining light from red, green, and blue emitting LEDs. The ratio of the intensities of the various colors sets the color of the light as perceived by a human observer.

To replace conventional lighting systems, LED-based sources that generate light that appears to be "white" to a human observer are required. In principle, a white appearing source can be constructed from three narrow band light sources as described above. In fact, many different spectral combinations can be utilized to provide a light source that looks white when viewed directly by a human observer. Consider a white light source constructed from three narrow band LEDs. To a human observer, the light looks white and can be made to appear the same as a conventional source such as an incandescent lamp when the user looks directly at the light. However, when the two light sources are used to illuminate a scene consisting of colored objects, the results are markedly different. To reproduce the colors observed in a scene that is illuminated with the light source in a manner that matches the colors observed when the scene is illuminated with an incandescent light or sun light, the "white" light source must have a spectrum that is more or less constant over the visual wavelengths between about 400 nm and 600 nm. The narrow band LED sources do not have this property.

One method for utilizing LEDs to provide a broad-spectrum light source utilizes phosphors that convert the LED light to light having longer wavelengths in a broad spectrum. For example, a phosphor that emits light over a broad range of red wavelengths can be illuminated with UV from an LED that generates a narrow UV spectrum. The phosphor-generated red light is then used as a component of the white light source. By combining several phosphors, one can, in principle, create a broad-spectrum white light source that is suitable for replacing incandescent lamps provided the light conversion efficiencies of the phosphors are sufficiently high.

Unfortunately, a lamp designer does not have an arbitrary set of phosphors from which to choose. There are a limited number of conventional phosphors that have sufficient light conversion efficiencies. The emission spectrum of these phosphors is not easily changed. Furthermore, the spectra are less than ideal in that the light emitted as a function of wavelength is not constant. Hence, even by combining several phosphors, an optimum white light source is not obtained.

"Quantum dot" (QD) phosphors are phosphors whose emission spectra depends on the size of the particles, and hence, can be used to convert light to a predetermined wavelength by utilizing the appropriate sized particles. Quantum dots are semiconductor nanometer sized crystals. As the size of the particles decrease, the particles reach a size at which the band gap of the material becomes dependent on the particle size. As a result, the emission spectrum is shifted to smaller wavelengths as the particle size is decreased. For example, CdSe quantum dots emit light at various wavelengths in the visible region of the spectrum. The emission wavelength depends only on the particle size, and hence, a phosphor having the desired emission wavelength can be constructed by controlling the particle size.

Unfortunately, the emission spectrum of any given quantum dot phosphor is very narrow. In addition, the conversion efficiency of these phosphors is significantly lower than that of conventional phosphors. Hence, to provide a phosphor composition having the desired spectral shape, a very large number of quantum dot phosphors must be utilized, which makes this approach impractical for low cost incandescent or fluorescent light replacements. In addition, the low light conversion efficiency reduces the cost savings, as higher power UV LEDs must be used to drive the phosphors.

SUMMARY OF THE INVENTION

The present invention includes a phosphor composition and a light source utilizing the same. The phosphor composition includes first and second phosphors. The first phosphor includes first phosphor particles of a first size, the first phosphor particles converting light of an excitation wavelength to light having a first spectrum characterized by an intensity of light that varies as a function of wavelength, the first spectrum is substantially independent of the size of the first phosphor particles. The second phosphor includes particles of a QD phosphor of a second size that convert light of the excitation wavelength to light having a QD phosphor spectrum characterized by an intensity of light that varies as a function of wavelength. In one embodiment, the first phosphor particles comprise particles of a first chemical composition and the second phosphor particles comprise phosphors of a second chemical composition. The first and second chemical compositions could be the same or different, depending upon the specific application. In one embodiment, the first phosphor particles and the QD phosphor particles are present in a ratio of concentrations, and the ratio, the first phosphor particles, and the QD phosphor particles are chosen such that a combined spectrum includes the QD phosphor spectrum and the first spectrum has an intensity that is more uniform as a function of wavelength than either the QD phosphor spectrum or the first spectrum. In one embodiment, the combined spectrum is perceived to be white light. In one embodiment, the first phosphor particles comprise particles chosen from the group consisting of garnet, sulphide, thiometallate, silicate, oxides, oxynitrides, nitrides, and selenide based phosphor. In one embodiment, the first phosphor particles are doped with a rare earth element. In one embodiment, the particles of the QD phosphor comprise CdS, CdSe, CdTe, CdPo, ZnS, ZnSe, ZnTe, ZnPo, Mgs, MgSe, MgTe, PbSe, PbS, PbTe, HgS, HgSe, HgTe, $Cd(S_{1-x}Se_x)$, $BaTiO_3$, $PbZrO_3$, $PbZr_zTi_{1-z}O_3$, $Ba_xSr_{1-x}TiO_3$, $SrTiO_3$, $LaMnO_3$, $CaMnO_3$, and $La_{1-x}Ca_xMnO_3$.

A light source according to the present invention includes an excitation light source that emits excitation light of an excitation wavelength and a layer of phosphor. The layer of phosphor includes first and second phosphors. The first phosphor includes first phosphor particles of a first size, the first phosphor particles converting light of an excitation wavelength to light having a first spectrum characterized by an intensity of light that varies as a function of wavelength, the first spectrum is substantially independent of the size of the first phosphor particles. The second phosphor includes particles of a QD phosphor of a second size that convert light of the excitation wavelength to light having a QD phosphor spectrum characterized by an intensity of light that varies as a function of wavelength. In one embodiment, the first phosphor particles comprise particles of a first chemical composition and the second phosphor particles comprise phosphors of a second chemical composition. The first and second chemical compositions could be the same or different, depending upon the specific application. In one embodiment, the first phosphor particles and the QD phosphor particles are present in a ratio of concentrations, and the ratio, the first phosphor particles, and the QD phosphor particles are chosen such that a combined spectrum includes the QD phosphor spectrum and the first spectrum that has an intensity that is more uniform as a function of wavelength than either the QD phosphor spectrum or the first spectrum. In one embodiment, the combined spectrum is perceived to be white light. In one embodiment, the first phosphor particles comprise particles chosen from the group consisting of garnet, sulphide, thiometallate, silicate, oxides, oxynitrides, nitrides, and selenide based phosphor. In one embodiment, the first phosphor particles are doped with a rare earth element. In one embodiment, the particles of the QD phosphor comprise CdS, CdSe, CdTe, CdPo, ZnS, ZnSe, ZnTe, ZnPo, Mgs, MgSe, MgTe, PbSe, PbS, PbTe, HgS, HgSe, HgTe, $Cd(S_{1-x}Se_x)$, $BaTiO_3$, $PbZrO_3$, $PbZr_zTi_{1-z}O_3$, $Ba_xSr_{1-x}TiO_3$, $SrTiO_3$, $LaMnO_3$, $CaMnO_3$, and $La_{1-x}Ca_xMnO_3$. In one embodiment, the excitation light source includes an LED. In one embodiment, the LED emits light having a wavelength between 200 nm and 480 nm.

BRIEF DESCRIPTION OF THE DRAWINGS

FIGS. 1 and 2 illustrate the spectrums generated by the individual phosphor components of a phosphor according to the present invention that is excited by light from a blue LED.

DETAILED DESCRIPTION OF THE PREFERRED EMBODIMENTS OF THE INVENTION

Figure 3:
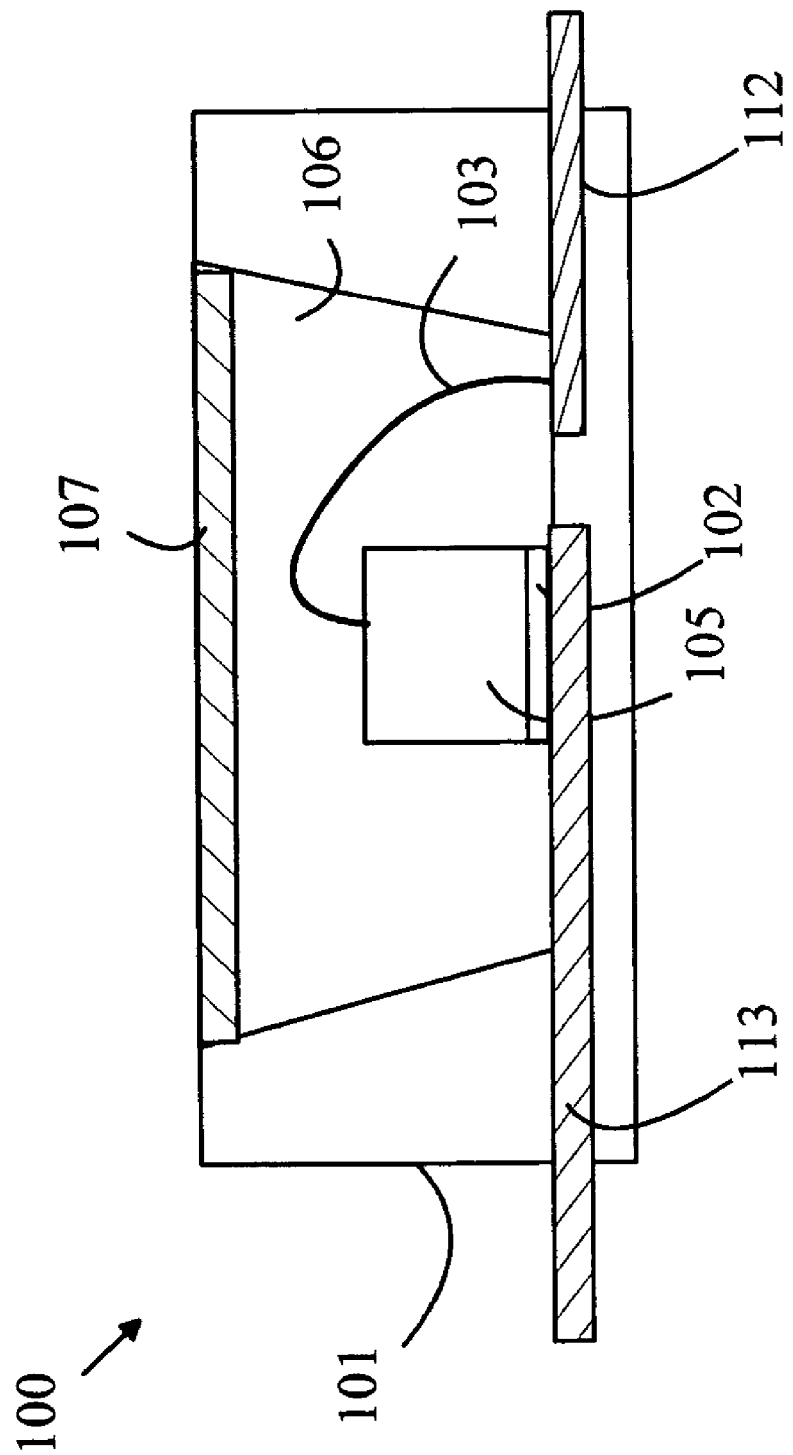
FIG. 3 is a cross-sectional view of a light source 100 that utilizes a phosphor layer according to one embodiment of the present invention.

For the purposes of the present discussion, a conventional phosphor particle is defined to be a particle of a phosphorescent or luminescent material in which the light emitted from the particle when the particle is excited by electromagnetic radiation of the appropriate wavelength has a spectrum that is substantially independent of the particle size, i.e., depends only on the chemical composition of the particle. For the purpose of this discussion, the spectrum will be said to be substantially independent of particle size if the shift in the wavelength of the dominant line in the spectrum in the optical region is less than 30 nm when the particle size is changed from 2 microns to 1 micron. In general, such particles have diameters greater than about one micron for emitted light in the optical portion of the electromagnetic radiation spectrum. A QD phosphor particle, on the other hand, is defined to be a particle of a phosphorescent or luminescent material in which the light emitted from the particle when the particle is excited by electromagnetic radiation of the appropriate wavelength has a spectrum that depends on the particle size as well as the chemical composition of the phosphorescent or luminescent material. In general, the size of the particles depends on the specific phosphor. For example, CdSe/ZnS QD phosphors have diameters ranging from 2 to 10 nm.

The present invention utilizes a compound phosphor to provide a phosphor composition that takes advantage of the best properties of conventional and QD phosphors. The manner in which the QD phosphor augments the spectrum of the conventional phosphor can be more easily understood with reference to FIGS. 1 and 2, which illustrate the spectrums generated by the individual phosphor components of a phosphor according to the present invention that is excited by light from a blue LED. In this example, two conventional phosphors 21 and 22 having emissions in the red and orange are excited by blue light 20. The spectrum from the conventional phosphors is augmented by a number of QD phosphors shown at 23-25 to provide a spectrum 26 shown in FIG. 2 that is much broader than the conventional phosphor spectra taken alone. In general, the conventional phosphors can be garnet based, sulphide, thiometallate, oxide, oxynitride, nitride, and silicate—based phosphors. The specific phosphors are chosen to provide the most efficient converted light system while providing a suitably broad spectrum. In general, the conventional phosphors are used in the regions in which those phosphors have the higher conversion efficiencies than the QD phosphors. In those regions where the conventional phosphor does not provide light or in which the QD phosphor provides higher light conversion efficiency, a QD phosphor with desired output spectrum is utilized.

QD phosphors are known to the art, and hence will not be discussed in detail here. For the purposes of the present discussion, it should be noted that QD phosphors can be made from particles of CdS, CdSe, CdTe, CdPo, ZnS, ZnSe, ZnTe, ZnPo, Mgs, MgSe, MgTe, PbSe, PbS, PbTe, HgS, HgSe, HgTe and $Cd(S_{1-x}Se_x)$. In addition, QD phosphors can be made from metal oxides such as $BaTiO_3$, $PbZrO_3$, $PbZr_zTi_{1-z}O_3$, $Ba_xSr_{1-x}TiO_3$, $SrTiO_3$, $LaMnO_3$, $CaMnO_3$, and $La_{1-x}Ca_xMnO_3$. In addition, it should be noted that a number of QD phosphors are available commercially from Evident Technologies having a place of business at 216 River Street Suite 200, Troy, N.Y. 12180.

In one embodiment of a light source according to the present invention, the phosphor particles are dispersed in a matrix such as clear epoxy. Refer now to FIG. 3, which is a cross-sectional view of a light source 100 that utilizes a phosphor layer according to one embodiment of the present invention. Light source 100 utilizes a layer of the phosphor composition of the present invention to convert the light from an excitation LED 105. A wavelength-conversion layer 107 is placed along the path of the light emitted by the LED. A portion of the radiation from LED 105 is absorbed by wavelength-conversion layer 107 which re-emits radiation having a combined spectrum that more nearly approximates an incandescent light source.

In this embodiment, LED 105 is first mounted on a cavity shaped substrate 101 using an adhesive layer 102. An electrical connection 103 is made from one of the terminals of LED 105 to a terminal 112. The second power connection is made from the bottom of the LED via terminal 113. The cavity contains a first layer of an optically clear encapsulant 106 and a second layer 107 of phosphor particles suspended in a clear epoxy matrix that provides the wavelength conversion.

In one embodiment of the present invention, the individual phosphor particles are coated with a material that serves two functions. First, the many conventional phosphor materials are sensitive to moisture. To protect the particles from moisture, a moisture resistant coating material is utilized. Second, both the conventional phosphor particles and the QD phosphor particles have a tendency to clump together. This results in relatively large particles that can scatter light as well as interfere with the uniformity of the phosphor particles within the epoxy matrix. A coating material that has an affinity for the matrix in which the particles are suspended reduces such clumping by overcoming the van der Waals binding force between the QD particles.

A number of coating procedures for QD phosphors are known in the art. The coating on the quantum dots can be (a) organic caps, (b) shells or (c) caps made of glass material. Organic caps can be formed on quantum dots using $Ag_2S$ and $Cd(OH)_2$, which may be passivated with $Cd^{2+}$ at high pH. A surface modification of the quantum dots is then performed by attaching dyes to the surface of the quantum dots. As an example, CdSe surface surfactant is labile and can be replaced by sequential addition of $Se^+$ and $Cd^{2+}$, which can grow to make a seed quantum dot larger. For a $Cd^{2+}$ rich surface, the surface can be treated with $Ph-Se^-$ and an organic coating is covalently linked to the surface. This isolation of molecular particles is referred to as "capped". Types of known capping molecules include Michelle liquids, Tio-terminations, Phosphate termination, Nitrogen termination (pyridine, pyrazine) and Dendron caps (multi-stranded ligands).

In one embodiment of the present invention, a compound phosphor particle is utilized in which the QD phosphor particles are coated onto the outside of the larger conventional phosphor particles. In this embodiment, the phosphors are combined by creating an enhanced phosphor particle that includes a core particle of a conventional phosphor that is coated with particles of the various QD phosphors in the correct concentration ratio to provide the desired combined spectrum. In one embodiment, the conventional phosphor particle is less than 10 microns in diameter so that the enhanced particle is less than 5 to 30 microns depending on the size of the conventional phosphor particle. The small size of the enhanced phosphor particle substantially reduces the amount of light scattering caused by the enhanced phosphor particle. Such scattering removes some of the excitation light, and hence, reduces the efficiency of the phosphor converted light source.

Figure 4:
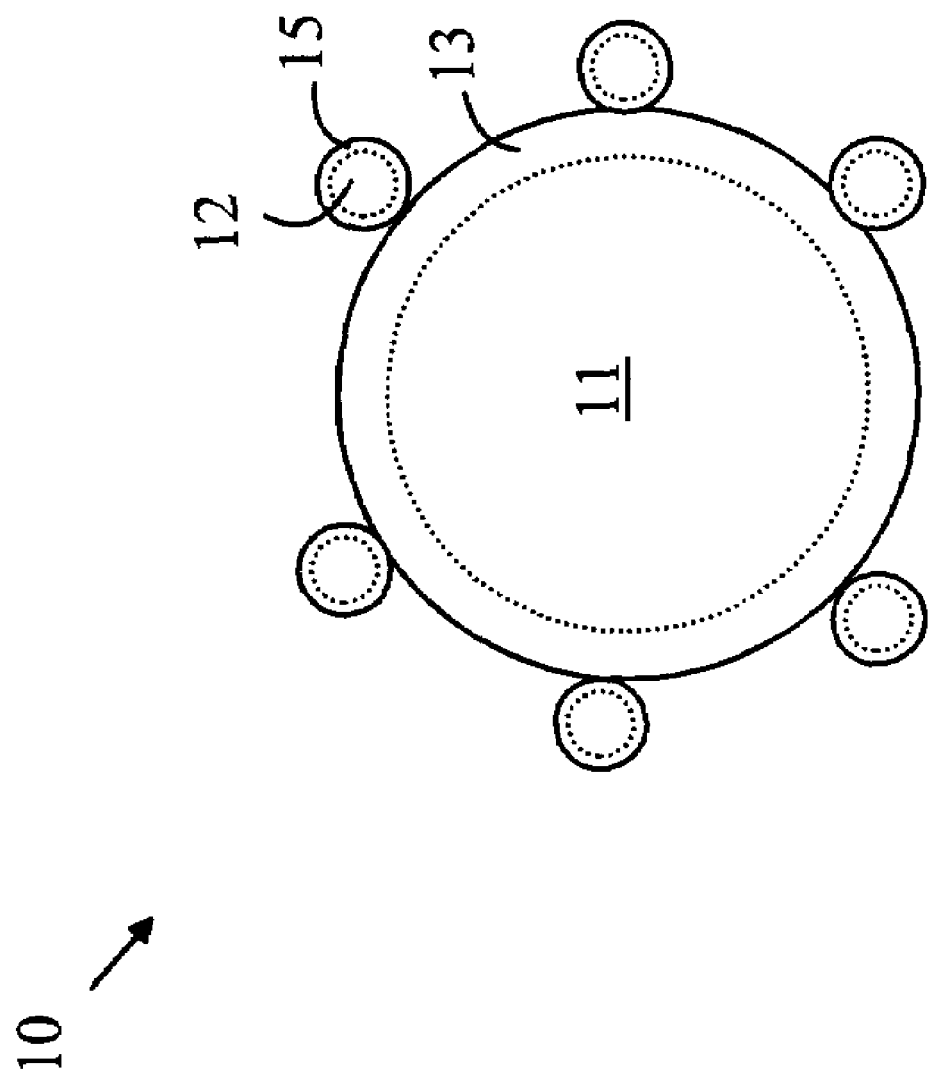
FIG. 4 is a cross-sectional view of a phosphor particle according to one embodiment of the present invention.

Refer now to FIG. 4, which is a cross-sectional view of a phosphor particle according to one embodiment of the present invention. Phosphor particle 10 includes a center particle 11 that is preferably formed from a conventional phosphor that emits a broad spectrum of light when illuminated with short wavelength light. Particle 11 is coated with a layer of quantum dot (QD) phosphor particles as shown at 12. The QD particle size is chosen such that the light emitted from the QD particles augments the spectrum of the conventional phosphor particle 11 to provide a spectrum that is more nearly ideal than that provided by either the QD particles or the conventional phosphor particles. The conventional phosphor particles are optionally coated with a layer of material 13 that provides protection from moisture.

The QD phosphor particles can also be coated with a layer 15 that reduces the affinity of the QD particles for one another. Such a layer inhibits the compound particles from sticking to one another as well as the QD particles from forming clumps. Coatings 13 and 15 can also be formulated such that particles 11 and particles 12 are attracted to one another.

In general, reducing the amount of excitation or converted light that is lost by scattering improves the efficiency of the light conversion process. The amount of scattering is significantly reduced if the particle diameter is small compared to the wavelength of the light being scattered. In one embodiment of the present invention, the phosphors are excited by blue light having a wavelength of approximately 200 to 480 nm. In this embodiment, the conventional phosphor particles are less than 10 microns in diameter. The QD phosphor particles are already less than this diameter. This reduces scattering loses for the excitation light, and hence, improves the efficiency of the light conversion process.

Various modifications to the present invention will become apparent to those skilled in the art from the foregoing description and accompanying drawings. Accordingly, the present invention is to be limited solely by the scope of the following claims.

What is claimed is:

1. A phosphor composition comprising:
   first phosphor particles of a first size, said first phosphor particles of a first size converting light of an excitation wavelength to light having a first spectrum characterized by an intensity of light that varies as a function of wavelength, said first spectrum being independent of said size of said first phosphor particles; and
   particles of a QD phosphor of a second size that convert light of said excitation wavelength to light having a QD phosphor spectrum characterized by an intensity of light that varies as a function of wavelength;
   wherein each of said first phosphor particles of a first size are coated with one or more of said particles of a QD phosphor of a second size.

2. The phosphor composition of claim 1 wherein said first phosphor particles of a first size comprise particles of a first chemical composition and said particles of a QD phosphor of a second size comprise phosphors of a second chemical composition.

3. The phosphor composition of claim 2 wherein said first chemical composition is different from said second chemical composition.

4. The phosphor composition of claim 1 wherein said first phosphor particles of a first size and said particles of a QD phosphor of a second size are present in a ratio of concentrations and wherein said ratio, said first phosphor particles of a first size, and said particles of a QD phosphor of a second size are chosen such that a combined spectrum comprising said QD phosphor spectrum and said first spectrum has an intensity that is more uniform as a function of wavelength than either said QD phosphor spectrum or said first spectrum.

5. The phosphor composition of claim 4 wherein said combined spectrum is perceived to be white light.

6. The phosphor composition of claim 1 wherein said first phosphor particles of a first size comprise particles chosen from the group consisting of garnet, sulphide, thiometallate, silicate, oxides, oxynitrides, nitrides, and selenide based phosphor.

7. The phosphor composition of claim 6 wherein said first phosphor particles of a first size are doped with a rare earth element.

8. The phosphor composition of claim 1 wherein said particles of a QD phosphor of a second size comprise CdS, CdSe, CdTe, CdPo, ZnS, ZnSe, ZnTe, ZnPo, Mgs, MgSe, MgTe, PbSe, PbS, PbTe, HgS, HgSe, HgTe, $Cd(S_{1-x},Se_x)$, $BaTiO_3$, $PbZrO_3$, $PbZr_zTi_{1-z}O_3$, $SrTiO_3$, $SrTiO_3$, $LaMnO_3$, $CaMnO_3$, and $La_{1-x}Ca_xMnO_3$.

9. The phosphor composition of claim 1 wherein said first phosphor particles of a first size are coated with a layer of material that provides protection from moisture.

10. The phosphor composition of claim 1 wherein said particles of a QD phosphor of a second size are coated with a layer of material that inhibits said particles of a QD phosphor of a second size from sticking to one another.

11. A light source comprising:
    an excitation light source that emits excitation light of an excitation wavelength;

a layer of phosphor comprising:
first phosphor particles of a first size, said first phosphor particles of a first size converting light of an excitation wavelength to light having a first spectrum characterized by an intensity of light that varies as a function of wavelength, said first spectrum being independent of said size of said first phosphor particles; and
particles of a QD phosphor of a second size that convert light of said excitation wavelength to light having a QD phosphor spectrum characterized by an intensity of light that varies as a function of wavelength;
wherein each of said first phosphor particles of a first size are coated with one or more of said particles of a QD phosphor of a second size.

12. The light source of claim 11 wherein said first phosphor particles of a first size comprise particles of a first chemical composition and said particles of a QD phosphor of a second size comprise phosphors of a second chemical composition.

13. The light source of claim 12 wherein said first chemical composition is different from said second chemical composition.

14. The light source of claim 11 wherein said first phosphor particles of a first size and said particles of a QD phosphor of a second size are present in a ratio of concentrations and wherein said ratio, said first phosphor particles of a first size, and said particles of a QD phosphor of a second size are chosen such that a combined spectrum comprising said QD phosphor spectrum and said first spectrum has an intensity that is more uniform as a function of wavelength than either said QD phosphor spectrum or said first spectrum.

15. The light source of claim 14 wherein said combined spectrum is perceived to be white light.

16. The light source of claim 15 wherein said combined spectrum further comprises a portion of said excitation light.

17. The light source of claim 11 wherein said first phosphor particles of a first size comprise particles chosen from the group consisting of garnet, sulphide, thiometallate, silicate, oxides, oxynitrides, nitrides, and selenide based phosphor.

18. The light source of claim 17 wherein said first phosphor particles of a first size are doped with a rare earth element.

19. The light source of claim 11 wherein said particles of a QD phosphor of a second size comprise CdS, CdSe, CdTe, CdPo, ZnS, ZnSe, ZnTe, ZnPo, Mgs, MgSe, MgTe, PbSe, PbS, PbTe, HgS, HgSe, HgTe, $Cd(S_{1-x},Se_x)$, $BaTiO_3$, $PbZrO_3$, $PbZr_zTi_{1-z}O_3$, $Ba_xSr_{1-x}TiO_3$, $LaMnO_3$, $CaMnO_3$, and $La_{1-x}Ca_xMnO_3$.

20. The light source of claim 11 wherein said first phosphor particles of a first size are coated with a layer of material that provides protection from moisture.

21. The light source of claim 11 wherein said particles of a QD phosphor of a second size are coated with a layer of material that inhibits said particles of a QD phosphor of a second size from sticking to one another.

* * * * *

UNITED STATES PATENT AND TRADEMARK OFFICE
CERTIFICATE OF CORRECTION

PATENT NO. : 7,495,383 B2 Page 1 of 1
APPLICATION NO. : 11/195199
DATED : February 24, 2009
INVENTOR(S) : Janet Bee Yin Chua and Yue Hoong Lau It is certified that error appears in the above-identified patent and that said Letters Patent is hereby corrected as shown below:

Column 6, Line 54 (approx.), Claim 8, delete "Mgs," and insert --MgS,--.

Column 6, line 56 (approx.), Claim 8, after "$PbZr_zTi_{1-z}O_3$," delete "$SrTiO_3$," and insert --$Ba_xSr_{1-x}TiO_3$,--.

Column 8, Line 16, Claim 19, delete "Mgs," and insert --MgS,--.

Column 8, Line 18, Claim 19, before "$LaMnO_3$," insert --$SrTiO_3$,--.

Signed and Sealed this

Twenty-first Day of December, 2010

David J. Kappos
*Director of the United States Patent and Trademark Office*